US012683102B2

(12) United States Patent
Lin et al.

(10) Patent No.: US 12,683,102 B2
(45) Date of Patent: ***Jul. 14, 2026

(54) BRACKET ASSEMBLY FACILITATING KEY SWITCH REPLACEMENT

(71) Applicant: Logitech Europe S.A., Lausanne (CH)

(72) Inventors: Feng-Hao Lin, Hsinchu City (TW); Yu-Chun Sun, Taipei City (TW); Lien Hsing Chen, Hsinchu City (TW); Fu-Kai Hsu, New Taipei City (TW)

(73) Assignee: Logitech Europe S.A., Lausanne (CH)

( * ) Notice: Subject to any disclaimer, the term of this patent is extended or adjusted under 35 U.S.C. 154(b) by 0 days.

This patent is subject to a terminal disclaimer.

(21) Appl. No.: 18/135,062

(22) Filed: Apr. 14, 2023

(65) Prior Publication Data

US 2023/0253169 A1      Aug. 10, 2023

Related U.S. Application Data

(63) Continuation of application No. 17/186,821, filed on Feb. 26, 2021, now Pat. No. 11,640,884.

(51) Int. Cl.
H01H 13/83      (2006.01)
H05F 3/02      (2006.01)
H05K 1/18      (2026.01)

(52) U.S. Cl.
CPC ............... H01H 13/83 (2013.01); H05F 3/02 (2013.01); H05K 1/18 (2013.01); H01H 2233/03 (2013.01); H05K 2201/10053 (2013.01)

(58) Field of Classification Search
CPC ... H01H 13/83; H01H 13/807–2233/03; H05F 3/02; H05K 1/18–2201/10053; G06F 3/0219; G06F 3/0224; G10H 1/344
See application file for complete search history.

(56) References Cited

U.S. PATENT DOCUMENTS

| 10,965,287 | B2 * | 3/2021 | Chen | .................... H03K 17/972 |
| 11,081,300 | B2 * | 8/2021 | Li | ........................ H01H 13/705 |

(Continued)

FOREIGN PATENT DOCUMENTS

| CN | 105185634 A | 12/2015 |
| CN | 204927142 U | 12/2015 |

(Continued)

OTHER PUBLICATIONS

"How to Remove and Replace Mechanical Switches on a Dygma Raise Keyboard", Youtube by Dygma Lab, Available Online at https://www.youtube.com/watch?v=O44o8Xao1CE&t=3s, Feb. 18, 2019, 2 pages.

(Continued)

*Primary Examiner* — Edwin A. Leon
(74) *Attorney, Agent, or Firm* — Kilpatrick Townsend & Stockton LLP

(57) ABSTRACT

A system may comprise a printed circuit board (PCB) including a top surface, and a bracket including a top surface configured to receive and couple to a key switch and a bottom surface including at least two protrusions that extend normal to the bottom surface of the bracket. The bracket can be configured to mount to the PCB such that the bottom surface of the bracket is coupled to the top surface of the PCB, and the at least two protrusions may each include conductive leads that couple to the top surface of the PCB. The bracket is configured to only cover a portion of a bottom surface of the key switch when coupled to the key switch. An LED can be mounted to the top surface of the PCB, laterally adjacent to the bracket, and under the key switch at a location not covered by the bracket.

10 Claims, 8 Drawing Sheets

(56) References Cited

U.S. PATENT DOCUMENTS

| | | | |
|---|---|---|---|
| 2016/0055988 A1 | 2/2016 | Muller | |
| 2020/0204178 A1 | 6/2020 | Chen | |

FOREIGN PATENT DOCUMENTS

| | | | | | |
|---|---|---|---|---|---|
| CN | 205319071 U | | 6/2016 | | |
| CN | 205388947 U | | 7/2016 | | |
| CN | 205 900 400 | * | 1/2017 | ........... | H01H 13/705 |
| CN | 108064410 A | | 5/2018 | | |

OTHER PUBLICATIONS

"Mechanical Keyboards", Dygma Lab, Available Online at: https://dygma.com/pages/mechanical-switches#:~:text=Underneath%20each%20key%20of%20a,typing%20easier%20on%20the%20fingers, 2020, 8 pages.

U.S. Appl. No. 17/186,821, "Non-Final Office Action", Apr. 29, 2022, 8 pages.

U.S. Appl. No. 17/186,821, "Non-Final Office Action", Sep. 1, 2022, 6 pages.

U.S. Appl. No. 17/186,821, "Notice of Allowance", Dec. 30, 2022, 5 pages.

CN202110342167.6, "Notice of Decision to Grant", Jan. 10, 2025, 6 pages.

CN202110342167.6, "Office Action", Jul. 6, 2024, 5 pages.

CN202120648062.9, "Notice of Decision to Grant", Jan. 13, 2022, 4 pages.

CN202120648062.9, "Utility Model Patentability Evaluation Report", Jul. 8, 2022, 6 pages.

* cited by examiner keycap — 405

Switch — 410

Metal plate — 420

412

412

414

ESD pin

Clip hole — 435b

Contact pin 2 — 440

LED — 450

PWA — 446

437

432

434

439

444

436

430

432

438

442

448

448

448

Contact pin 1 — 435a

Clip hole — 432

GX socket

SMD pads

400 y z x

BRACKET ASSEMBLY FACILITATING KEY SWITCH REPLACEMENT

CROSS REFERENCE PARAGRAPH FOR PRIORITY

This application is continuation of U.S. Non-Provisional application Ser. No. 17/186,821, filed on Feb. 26, 2021, and titled "BRACKET ASSEMBLY FOR A KEY SWITCH," which is hereby incorporated by reference in its entirety for all purposes.

BACKGROUND

Peripheral devices generally include any auxiliary device that can be used to interface human and computer. Some common peripheral devices include keyboards, computer mice, image scanners, speakers, microphones, web cameras, and more. Keyboards, for instance, have improved in function and performance over the last few decades to increase user productivity, ergonomics and performance. For instance, the advent of function keys, key pads, programmable hot keys, scroll wheels, and the like, have helped users become more efficient by placing commonly used functions in quickly accessible locations.

Key switches, in particular, have been improved and modified to adapt to particular user needs. A key switch is a mechanism that registers a key stroke and can vary in response profiles, sound, and travel times, which can be selected to suit a user's needs. Some key switch profiles can have increased tactile feedback, a linear feedback profile, faster response times (e.g., shorter activation thresholds), or relatively quiet operation to name a few common key switch types. A user typically has to decide which type of keyboard to buy based on a particular need. A user may buy a keyboard with "fast" key structures for gaming applications, a keyboard with relatively quiet key structures for office applications, or the like. While a diversity of key structures and specialization can be useful to accommodate different user needs, a user may have to buy multiple keyboards to benefit from these advantages, or commit to one keyboard that works well for one use, but may not be well adapted for other uses. Improvements are needed to address these issues.

It should be noted that unless otherwise indicated herein, the materials described in this section are not prior art to the claims in this application and are not admitted to be prior art by inclusion in this section.

BRIEF SUMMARY

In some embodiments, a system can comprise a printed circuit board (PCB) including a top surface, a bracket including a top surface configured to receive and couple to a key switch, and a bottom surface including at least two protrusions that extend normal to the bottom surface of the bracket. The bracket can be configured to mount to the PCB such that the bottom surface of the bracket is coupled to the top surface of the PCB. The at least two protrusions can each include conductive leads that couple to the top surface of the PCB. In some aspects, the bracket is configured to only cover a portion of a bottom surface of the key switch when coupled to the key switch. The system can include an LED mounted to the top surface of the PCB, laterally adjacent to the bracket, and under the key switch at a location not covered by the bracket. In some embodiments, the bracket further includes an electrostatic discharge (ESD) pin configured to couple ESD to a ground plane of the PCB. In some aspects, a top plate is configured to receive clips from the key switch that engage with the top plate when the key switch is coupled to the bracket, where the top plate provides structural support for the key switch. The PCB can include at least two holes configured to receive the two protrusions from the bracket when the bracket is coupled to the top surface of the PCB. The top surface of the bracket can include one or more holes or recesses configured to receive the one or more protrusions from the key switch. The top surface and bottom surface of the bracket may be substantially planar and in parallel to each other, and the conductive leads of the at least two protrusions extend laterally from the bracket at an angle substantially defined by a planar surfaces of the top and bottom surfaces of the bracket. The conductive leads may be soldered to the PCB via a solder reflow process. In some aspects, the at least two protrusions of the bracket extend at least partially through the PCB when the bracket is mounted to the PCB.

In some embodiments, a system comprises a PCB including a top surface and a plurality of brackets, each of the plurality of brackets including a top surface configured to receive and couple to a corresponding key switch of a plurality of key switches, and a bottom surface including at least two protrusions that extend normal to the bottom surface of the corresponding bracket. Each of the plurality of brackets can be configured to mount to the PCB such that the bottom surface of each of the plurality of brackets is coupled to a corresponding location on the top surface of the PCB. In some aspects, the at least two protrusions each include conductive leads that couple to the top surface of the PCB. The bracket can be configured to only cover a portion of a bottom surface of the key switch when coupled to the key switch. The system may include a plurality of LEDs mounted to the top surface of the PCB, each of the plurality of LEDs mounted laterally adjacent to a corresponding bracket of the plurality of brackets, and under a corresponding key switch at a location not covered by the corresponding bracket. The system can include a top plate configured to provide structural support for each of the plurality of key switches, wherein the top plate is configured to receive clips from each of the plurality of key switches that engage with the top plate when the plurality of key switches are coupled to their corresponding brackets. The PCB may include at least two holes configured to receive the two protrusions from the bracket when the bracket is coupled to the top surface of the PCB.

In further embodiments, an apparatus comprises a bracket including a top surface configured to receive and couple to a key switch, and a bottom surface including at least two protrusions that extend normal to the bottom surface of the bracket. The bracket may be configured to mount to a PCB such that the bottom surface of the bracket is coupled to a top surface of the PCB. The at least two protrusions may each include conductive leads that are configured to couple to the top surface of the PCB. The bracket may be configured to only cover a portion of a bottom surface of the key switch when coupled to the key switch. In some aspects, the conductive leads of the at least two protrusions extend laterally from the bracket, and wherein a conductive path is closed when the key switch is triggered that leads from the key switch to the bracket and laterally from the bracket to the top surface of the PCB via the conductive leads.

This summary is not intended to identify key or essential features of the claimed subject matter, nor is it intended to be used in isolation to determine the scope of the claimed subject matter. The subject matter should be understood by reference to appropriate portions of the entire specification of this disclosure, any or all drawings, and each claim.

The foregoing, together with other features and examples, will be described in more detail below in the following specification, claims, and accompanying drawings.

The terms and expressions that have been employed are used as terms of description and not of limitation, and there is no intention in the use of such terms and expressions of excluding any equivalents of the features shown and described or portions thereof. It is recognized, however, that various modifications are possible within the scope of the systems and methods claimed. Thus, it should be understood that, although the present system and methods have been specifically disclosed by examples and optional features, modification and variation of the concepts herein disclosed should be recognized by those skilled in the art, and that such modifications and variations are considered to be within the scope of the systems and methods as defined by the appended claims.

BRIEF DESCRIPTION OF THE DRAWINGS

The features of the various embodiments described above, as well as other features and advantages of certain embodiments of the present invention will be more apparent from the following detailed description taken in conjunction with the accompanying drawings, in which.

Throughout the drawings, it should be noted that like reference numbers are typically used to depict the same or similar elements, features, and structures.

DETAILED DESCRIPTION

Figure 1:
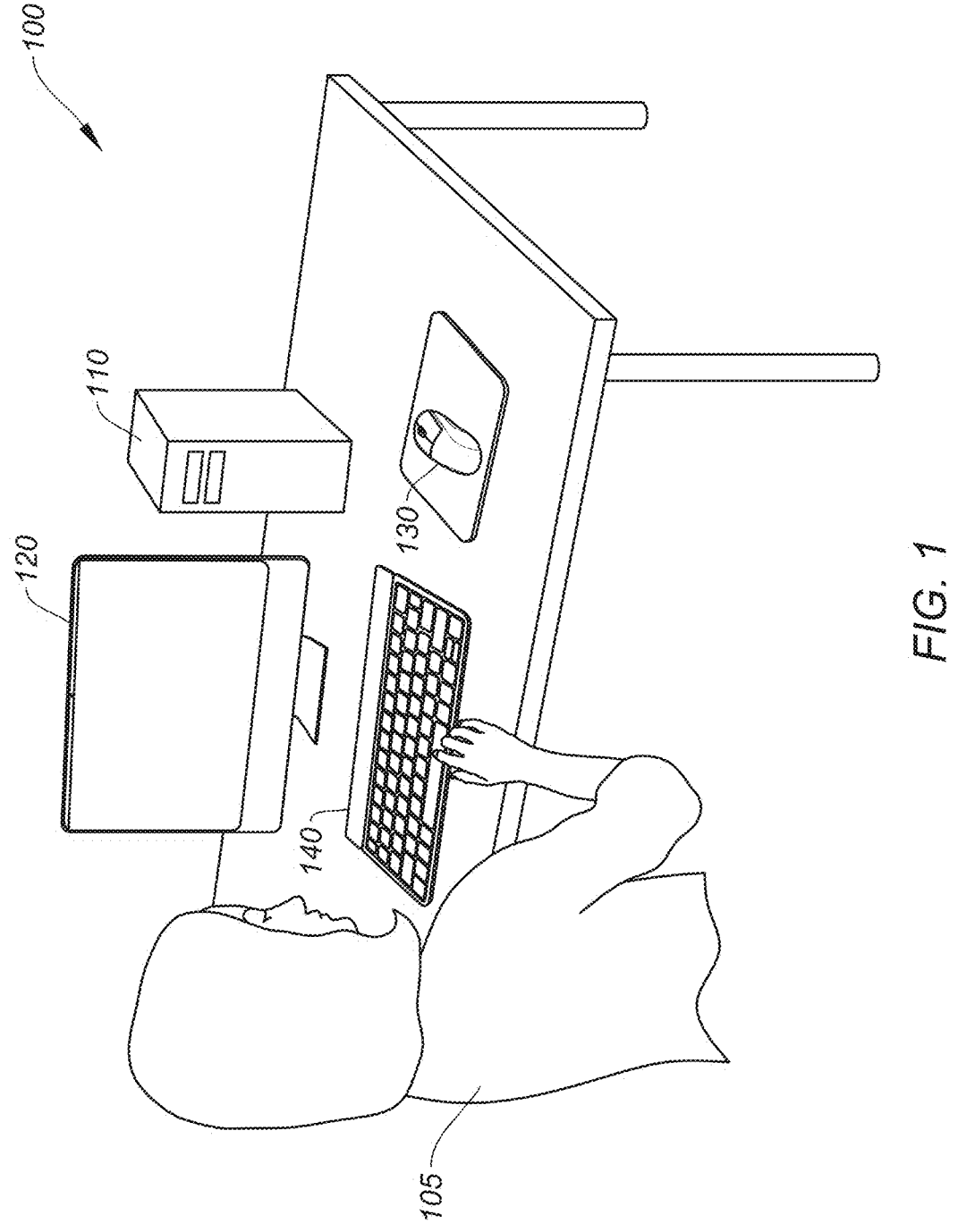
FIG. 1 shows a keyboard in typical system environment.

Aspects of the present disclosure relate generally to computer peripheral devices, and more particularly to key structures of a keyboard, according to certain embodiments.

In the following description, various examples of novel key structures that enable users to "hot swap" key switches are described. For purposes of explanation, specific configurations and details are set forth in order to provide a thorough understanding of the embodiments. However, it will be apparent to one skilled in the art that certain embodiments may be practiced or implemented without every detail disclosed. Furthermore, well-known features may be omitted or simplified in order to prevent any obfuscation of the novel features described herein.

The following high level summary is intended to provide a basic understanding of some of the novel innovations depicted in the figures and presented in the corresponding descriptions provided below. Contemporary keyboards and other computer peripheral devices that employ keyboard-like keys often utilize key switches. A key switch is a mechanism that registers a key stroke and can vary in response profiles, sound, travel time and travel distance, which can be selected to suit a user's needs. For instance, some key switch profiles can have different tactile feedback (e.g., how "clicky" the key feels), some profiles may be linear, some can have faster response times (e.g., shorter activation thresholds), some may have a relatively quieter operation, among other mechanical characteristics, and some may be any combination thereof. A user typically has to decide which type of keyboard to buy based on the key properties that are useful for a particular application (e.g., gaming, office productivity, casual use, etc.) and may need to buy multiple keyboards to accommodate multiple types of applications.

Aspects of the invention can solve this problem by providing a bracket assembly that allows a user to "hot swap" or quickly remove a key switch from a computer peripheral device (e.g., keyboard 140) and swap it out with a different key switch, which can be done without time consuming and complicated assembly or disassembly processes. That is, a user can simply remove a key cap on a key structure, pull the existing key switch out of a socket (e.g., bracket assembly 430), plug in a new key switch, and replace the key cap, which can be done in seconds. Although many of the embodiments described herein apply to particular key switch types (e.g., MX Cherry-type switches), it should be understood that the concepts described herein can be applied to any type of key switch mechanism.

According to some embodiments (see, e.g., FIG. 4), a system operable to enable hot swapping of a key switch can include a printed circuit board (PCB) including a top surface, a bracket assembly including a top surface configured to receive and couple to a key switch and a bottom surface including at least two protrusions that extend normal to the bottom surface of the bracket assembly. The bracket may be configured to mount to the PCB such that the bottom surface of the bracket assembly is coupled to the top surface of the PCB, and the at least two protrusions may each include conductive leads that couple to the top surface of the PWB. The bracket assembly may be configured to only cover a portion of a bottom surface of the key switch when coupled to the key switch to accommodate a placement of an LED under the key switch that can direct light to illuminate a corresponding key cap. The LED can be mounted to the top surface of the PCB, laterally adjacent to the bracket, and under the key switch at a location not covered by the bracket assembly. The bracket can further include an electrostatic discharge (ESD) pin configured to couple ESD to a ground plane of the PCB. A top plate (e.g., the key frame of the keyboard) can provide structural support for the key switch, and can receive clips from the key switch that engage with the top plate when the key switch is coupled to the bracket. The PCB can include at least two holes configured to receive the at least two protrusions from the bracket assembly, and the at least two protrusions may extend at least partially through the PCB when the bracket assembly is coupled to the PCB. The top surface of the bracket can include one or more holes or recesses configured to receive one or more protrusions from the key switch. In some embodiments, the top surface and bottom surface of the bracket can be substantially planar and the conductive leads of the at least two protrusions may extend laterally from the bracket at an angle substantially defined by a planar surfaces of the top and bottom surfaces of the bracket and can be soldered to the PCB via a solder reflow process.

It is to be understood that this high-level summary is presented to provide the reader with a baseline understanding of some of the novel aspects of the present disclosure and a roadmap to the details that follow. This high-level summary in no way limits the scope of the various embodiments described throughout the detailed description and each of the figures referenced above are further described below in greater detail and in their proper scope.

FIG. 1 shows an example of a computer system 100 that can include any of a variety of host computing devices and computer peripheral devices, including peripheral devices (e.g., a keyboard, computer mouse, etc.) that can be configured to include aspects of the various inventive concepts described herein. Computer system 100 shows a user 105 operating a host computing device (shown as a desktop computer) 110 and a number of computer peripheral devices communicatively coupled to host computing device 110, including a display device 120, a computer mouse 130, and keyboard 140, and may include any other suitable computer peripheral device(s).

Although the host computing device is shown as a desktop computer, other types of host computing devices can be used including gaming systems, laptop computers, set top boxes, entertainment systems, tablet or "phablet" computers, stand-alone head mounted displays (HMDs), or any other suitable host computing device (e.g., smart phone, smart wearable, internet-of-things (IoT) devices, or the like). In some cases, multiple host computing devices may be used and one or more of the computer peripheral devices may be communicatively coupled to one, some, or all of the host computing devices (e.g., a computer keyboard may be coupled to multiple host computing devices). A host computing device may also be referred to herein as a "host," "host computer," "host device," "computing device," "computer," or the like, and may include a machine readable medium (not shown) configured to store computer code, such as driver software, firmware, and the like, where the computer code may be executable by one or more processors of the host computing devices(s) to control aspects of the host computing device, for instance via the one or more computer peripheral devices.

A typical computer peripheral device can include any suitable input device, output device, or input/output device including those shown (e.g., computer keyboard 140) and not shown (e.g., game controller, HMD, remote control, etc.), AR/VR controller, joystick, stylus device, or other suitable device that can be used to convert analog inputs into digital signals for computer processing. By way of example, a computer peripheral device (e.g., keyboard 140) can be configured to provide control signals for input detection (e.g., alphanumeric input, knob/wheel movement, etc.), output functions (e.g., LED control, haptic feedback, displays, etc.), or any of myriad other features that can be provided by a computer peripheral device, as would be appreciated by one of ordinary skill in the art with the benefit of this disclosure.

A computer peripheral device may be referred to as an "input device," "peripheral input device," "peripheral device," "computer input device," "user interface device," "control device," "input unit," or the like. The majority of the embodiments described herein generally refer to a particular computer peripheral device (keyboard 140), however it should be understood that a computer peripheral device can be any suitable input/output (I/O) device that may be adapted to utilize the novel embodiments described and contemplated herein.

Figure 2:
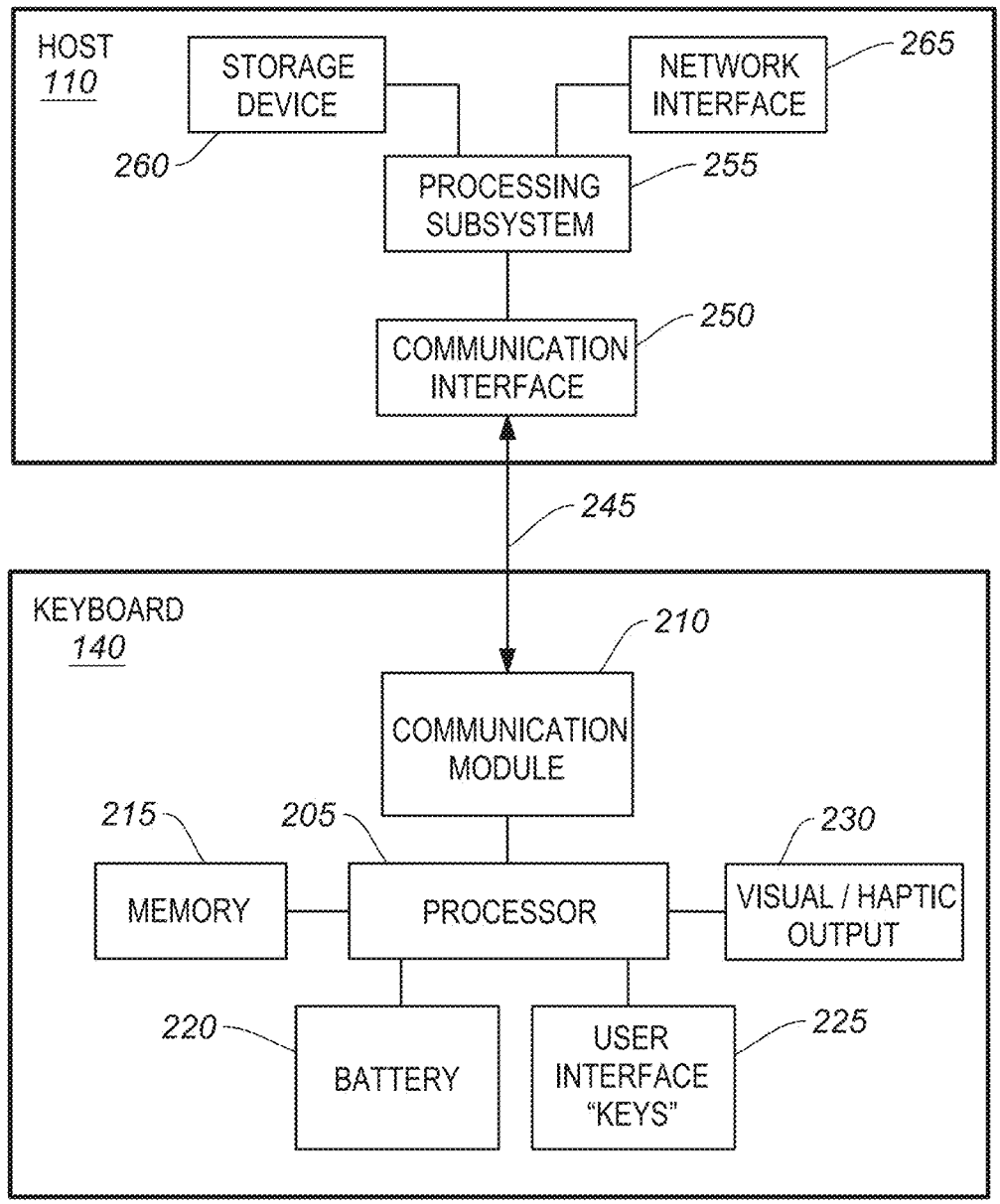
FIG. 2 shows a simplified system block diagram of a keyboard and a host computing device, according to certain embodiments.

FIG. 2 illustrates a simplified block diagram of keyboard 140 and an example host computing device 110 shown in FIG. 1. As shown in FIG. 2, keyboard 140 can include a processor 205 that is coupled to a communication module 210, a memory 215, a battery 220, one or more user interface keys 225 and visual/haptic output module 230. Plurality of user interface keys 225 can be configured to be physically actuated by a user of the keyboard with each key communicating a particular signal to processor 205. Processor 205 includes circuitry that receives a particular signal from each user interface key 225 and responds by commanding communication module 210 to transmit a signal corresponding to that particular key to host computer 110 via communication channel 245. Processor 205 can be programmed to employ one or more visual and/or haptic outputs 230 (e.g., lights, audible sounds, vibrations, etc.), as would be appreciated by one of ordinary skill in the art with the benefit of this disclosure.

In some embodiments, battery 220 can independently power some or all of the keyboard functional blocks 205-225, including processor 205. In such embodiments, keyboard 140 can be configured independently from host computing device 110 with the configurations stored in memory 215. In further embodiments, keyboard 140 can be used with multiple host computing devices 110 and can maintain a constant configuration regardless of the host that it is communicating with. Further, in some embodiments there may be no need for a host computing device to install software to communicate with keyboard 140.

Processor 205 can include any type of logic device including a programmable integrated circuit or, e.g., one or more single-core or multi-core microprocessors and/or microcontrollers executing program code to perform various functions associated with keyboard 140. For example, processor 205 can implement various processes (or portions thereof) described throughout this disclosure as being implemented by a peripheral device, e.g., by executing program code stored in memory 215. Processor 205 can also execute other programs to control other functions of keyboard 140. In some instances, programs executed by processor 205 can interact with a host computer (e.g., host computer 110) by generating messages to be sent to the host computer and/or receiving messages from the host computer. In some instances, the messages can be sent and/or received using communication module 210 or a wired connection (e.g., universal serial bus (USB)).

Communication module 210 can provide wireless or wired communication capability for keyboard 140. In some embodiments communication module 210 can include radio frequency (RF) transceiver components for accessing wireless voice and/or data networks (e.g., using cellular telephone technology, data network technology such as 3G, 4G/LTE, Wi-Fi, other IEEE 802.11 family standards, or other mobile communication technologies, or any combination thereof), components for short-range wireless communication (e.g., using Bluetooth and/or Bluetooth LE standards, NFC, etc.), and/or other components. In some embodiments communication module 210 can provide wired network connectivity (e.g., Ethernet) in addition to or instead of a wireless interface. Communication module 210 can be implemented using a combination of hardware (e.g., driver circuits, antennas, modulators/demodulators, encoders/decoders, and other analog and/or digital signal processing circuits) and software components. In some embodiments, communication module 210 can support multiple communication channels concurrently or at different times, using the same transport or different transports. Thus, for example, keyboard 140 can communicate with a host via a local channel at some times and via a relay service at other times.

Memory 215 can be implemented, e.g., using disk, flash memory, or any other non-transitory storage medium, or a combination of media, and can include volatile and/or non-volatile media. In some embodiments, memory 215 can store one or more programs (e.g., firmware) to be executed by processor 205, including programs to implement various operations described as being performed by a keyboard or other suitable computer peripheral devices. Memory 215 can also store a peripheral device object or peripheral device definition record that can be furnished to host computing devices, e.g., during device discovery. Memory 215 can also store peripheral device state information and any other data that may be used during operation of keyboard 140. Memory 215 can also store program code executable to communicate with a communication interface 250.

Battery 220 can include any type of energy storage device including rechargeable and non-rechargeable devices. In some embodiments battery 220 is nickel metal hydride, nickel cadmium, lithium-ion or lead acid configuration. One of skill in the art with the benefit of this disclosure will appreciate that other types of energy storage devices can be used. In some embodiments battery 220 can be wirelessly rechargeable.

User interface keys 225 can include user-operable input devices such as one or more depressible keys. Each user interface key 225 can correspond to a unique signal that is communicated to processor 205 so the processor recognizes the user's desired input. In certain embodiments, user interface keys 225 can include any type of key that utilizes a key switch, as further described at least with respect to FIGS. 3-8.

Visual/haptic output 230 can include any output device that can be used to communicate with a user. In some embodiments lights can be turned on or off, lights can change colors, lights can flash at different rates. Haptic devices can vibrate, ping or tap the keyboard and in some embodiments may include unbalanced motors that provide vibrations and/or voice coils. In various embodiments a haptic device can be included in a base or wrist rest or they can be key specific. Audible devices can emit beeps, tones, music, recorded messages and/or electronically generated messages. In further embodiments display screens can be used. In some embodiment one or more lights that illuminate keys can be used as a digitized display screen. That is each key light can be used to display an alphanumeric message to the user. The message can be stationary and/or the message can scroll, and/or the message can include sequentially displayed characters. One of skill in the art with the benefit of this disclosure will appreciate that other types of visual/haptic output devices can be used without departing from this disclosure.

FIG. 2 also shows a simplified block diagram of an example host computing device, which may be illustrative of the features and functions of host device 110 illustrated in FIG. 1 (or other suitable host computing device(s)), according to certain embodiments. In some embodiments, host computing device 110 can implement any or all of the functions, behaviors, and capabilities described herein as being performed by a host computing device, as well as other functions, behaviors, and capabilities not expressly described. Host computing device 110 can include processing subsystem 255, storage device 260, network interface 265, communication interface 250. Host computing device 110 can also include other components (not explicitly shown) such as a battery, power controllers, and other components operable to provide various enhanced capabilities. In various embodiments, host computing device 110 can be implemented in a desktop computer, laptop computer, tablet computer, smart phone, other mobile phone, wearable computing device, cellular phone or other systems having any form factor. Further, in some embodiments host computing device 110 can be implemented partly in a base station and partly in a mobile unit that communicates with the base station and provides a user interface.

Communication interface 250 can provide voice and/or data communication capability for host computing device 110. In some embodiments communication interface 250 can include radio frequency (RF) transceiver components for accessing wireless voice and/or data networks (e.g., using cellular telephone technology, data network technology such as 3G, 4G/LTE, Wi-Fi, other IEEE 802.11 family standards, or other mobile communication technologies, or any combination thereof), components for short-range wireless communication (e.g., using Bluetooth and/or Bluetooth LE standards, NFC, etc.), and/or other components. In some embodiments communication interface 250 can provide wired network connectivity (e.g., Ethernet) in addition to or instead of a wireless interface. Communication interface 250 can be implemented using a combination of hardware (e.g., driver circuits, antennas, modulators/demodulators, encoders/decoders, and other analog and/or digital signal processing circuits) and software components. In some embodiments, communication interface 250 can support multiple communication channels concurrently or at different times, using the same transport or different transports. Thus, for example, host computing device 110 can communicate with accessories via a local channel at some times and via a relay service at other times.

Processing subsystem 255 can be implemented as one or more integrated circuits, e.g., one or more single-core or multi-core microprocessors or microcontrollers, examples of which are known in the art. In operation, processing system 255 can control the operation of host computing device 110. In various embodiments, processing subsystem 255 can execute a variety of programs in response to program code and can maintain multiple concurrently executing programs or processes. At any given time, some or all of the program code to be executed can be resident in processing subsystem 255 and/or in storage media such as storage device 260.

Through suitable programming, processing subsystem 255 can provide various functionality for host computing device 110. For example, in some embodiments, processing subsystem 255 can implement various processes (or portions thereof) described above as being implemented by a host computing device. Processing subsystem 255 can also execute other programs to control other functions of host computing device 110, including application programs that may be stored in storage device 260. In some embodiments, these application programs may interact with a peripheral device, e.g., by generating messages to be sent to the peripheral device and/or receiving responses from the peripheral device. Such interactions can be facilitated by a peripheral device management daemon and/or other operating system processes, e.g., as described above, and can include communicating with the peripheral device via a communication interface 250.

Storage device 260 can be implemented, e.g., using disk, flash memory, or any other non-transitory storage medium, or a combination of media, and can include volatile and/or non-volatile media. In some embodiments, storage device 260 can store one or more application and/or operating system programs to be executed by processing subsystem 255, including programs to implement various operations described above as being performed by a host computing device. For example, storage device 260 can store a uniform host application that can read a peripheral device description record and generate a graphical user interface for controlling the peripheral device based on information therein. Storage device 260 can also store program code executable to communicate with a communication module 210 of a peripheral keyboard device (e.g., keyboard 140). Although FIG. 2 illustrates communication interface 250 as a subsystem of host computing device 110 it is understood that communication interface 250 may be a dongle that is plugged into and electrically coupled with host computing device 110. In some embodiments, portions (or all) of the host computing device functionality described herein can be implemented in operating system programs rather than applications. In some embodiments, storage device 260 can also store applications ("apps") designed for specific accessories or specific categories of accessories.

Network interface 265 can include any type of connection to a network including wired Ethernet, RS-232 or other and wireless including, data network technology such as 3G, 4G/LTE, Wi-Fi, other IEEE 802.11 family standards, or other mobile communication technologies, or any combination thereof), components for short-range wireless communication (e.g., using Bluetooth and/or Bluetooth LE standards, NFC, etc.), and/or other components. In some embodiments network interface 265 can provide wired network connectivity (e.g., Ethernet) in addition to or instead of a wireless interface. Network interface 265 can be implemented using a combination of hardware (e.g., driver circuits, antennas, modulators/demodulators, encoders/decoders, and other analog and/or digital signal processing circuits) and software components.

Further, while a host is described herein with reference to particular blocks, it is to be understood that these blocks are defined for convenience of description and are not intended to imply a particular physical arrangement of component parts. Further, the blocks need not correspond to physically distinct components. Blocks can be configured to perform various operations, e.g., by programming a processor or providing appropriate control circuitry, and various blocks might or might not be reconfigurable depending on how the initial configuration is obtained. Embodiments of the present disclosure can be realized in a variety of apparatus including electronic devices implemented using any combination of circuitry and software.

Host computing devices and peripheral devices described herein can be implemented in electronic devices that can be of generally conventional design. Such devices can be adapted to communicate using a uniform peripheral device protocol that supports command-and-control operations by which a host (a first electronic device) can control operation of a peripheral device (a second electronic device). In some instances, a device can combine features or aspects of a host and a peripheral device, e.g., in the case of a proxy as described above.

It will be appreciated that the system configurations and components described herein are illustrative and that variations and modifications are possible. It is to be understood that an implementation of host computing device 110 can perform all operations described above as being performed by a media access device and that an implementation of keyboard 140 can perform any or all operations described above as being performed by a peripheral device. A proxy, bridge, tunnel, or coordinator can combine components of host computing device 110 and keyboard 140, using the same hardware or different hardware as desired. The media access device and/or peripheral device may have other capabilities not specifically described herein (e.g., mobile phone, global positioning system (GPS), broadband data communication, Internet connectivity, etc.). Depending on implementation, the devices can interoperate to provide any functionality supported by either device (or both) or provide functionality that is partly implemented in each device. In some embodiments, a particular peripheral device can have some functionality that is not accessible or invocable via a particular media access device but is accessible via another host or by interacting directly with the peripheral device.

Further, while the media access device and peripheral device are described herein with reference to particular blocks, it is to be understood that these blocks are defined for convenience of description and are not intended to imply a particular physical arrangement of component parts. Further, the blocks need not correspond to physically distinct components. Blocks can be configured to perform various operations, e.g., by programming a processor or providing appropriate control circuitry, and various blocks might or might not be reconfigurable depending on how the initial configuration is obtained. Embodiments of the present disclosure can be realized in a variety of apparatus including electronic devices implemented using any combination of circuitry and software.

Figure 3:
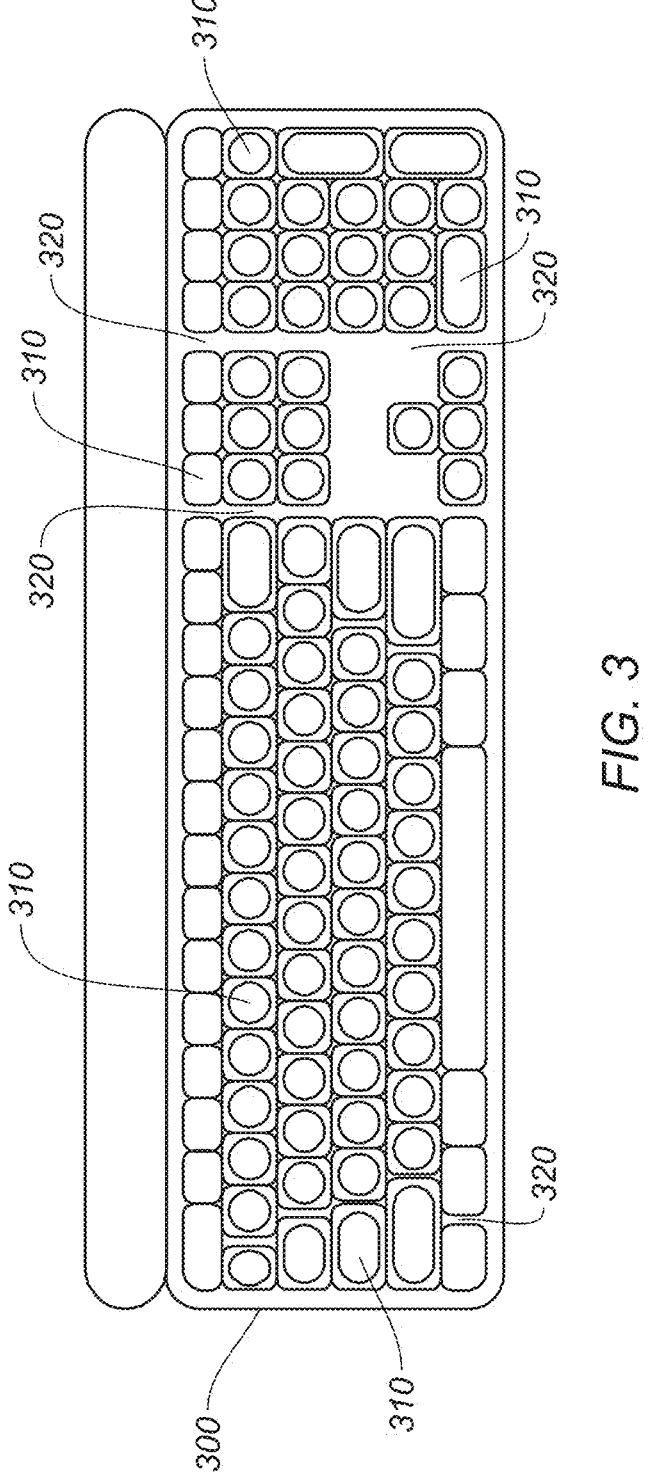
FIG. 3 shows a keyboard including a plurality of key structures with key caps, according to certain embodiments.

FIG. 3 shows a keyboard 300 including a plurality of key structures 310, according to certain embodiments. Keyboard 300 can include any suitable number and/or arrangement of key structures, and the key structures can be configured to trigger any suitable output including, but not limited to, an alphanumeric output, functional output (e.g., functional keys), directional (e.g., arrow keys), multiple outputs (e.g., a number and symbol), or the like. In some cases, a haptic output (e.g., vibration) or visual output (e.g., lighting) may be associated with one or more key structures. The key structures are arranged within and can be coupled to a key frame 320, which is also referred to as a "top plate," as further described below at last with respect to FIG. 4. The key structures of FIG. 3 only show the key caps for each key structure, however a more detailed view and corresponding discussion of the novel features presented herein are better shown and described in FIGS. 4-8.

In some embodiments, a key structure can include a key switch. A key switch is a mechanism that registers a key stroke and can vary in response profiles, sound, travel time and travel distance. Many contemporary keyboards employ Cherry® "Mechanical X-Point"® or "MX" key switches, which exhibit excellent performance characteristics, including a wide range of possible force profiles (e.g., the "feel" of the key press) and operational longevity (e.g., over 50 million strokes before material signal degradation). Though key switches may differ, key switches typically include a stem and a corresponding precision coil spring forming a mechanical module that operates to define the operational characteristics of the key (e.g., linear operation, actuation force threshold, etc.), and a cross-mount (e.g., which can appear as a "plus" or cross on the top of the key switch, as shown for instance in FIG. 4). Key switches can include an upper housing, which covers the mechanical module, and can operate to facilitate precision guidance of the switching slide. Key switches may further include a cross-point contact (e.g., made of copper, gold, or other suitable conductive material) to close the electrical circuit when the key is depressed to trigger the key structure output. A housing base can serve as a base of the key switch and is often reinforced (e.g., with glass fiber) to achieve pressure stability and durability. As described above, key switches can have widely varying performance characteristics. Some key switches can have a tactile output, where the module has a noticeable and/or audible click point, or "clickiness," which is a distinctive feature of mechanical keyboards. Linear key switches typically do not include this type of physical feedback and have feedback that with linear resistance characteristics. Some types of key switches can be configured for gaming (e.g., fast triggering with minimal activation force), office productivity (e.g., tactile with a detectable actuation point with or without a click), precision (e.g., tactile with high activation force), accuracy (e.g., linear with a tighter coil spring for quicker return to an at-rest position of the key switch), and speed (e.g., low activation force, short pre-travel, and linear switching), to name a few. One of ordinary skill in the art with the benefit of this disclosure would appreciate the many modifications, variations, and alternative embodiments thereof.

Figure 4B:
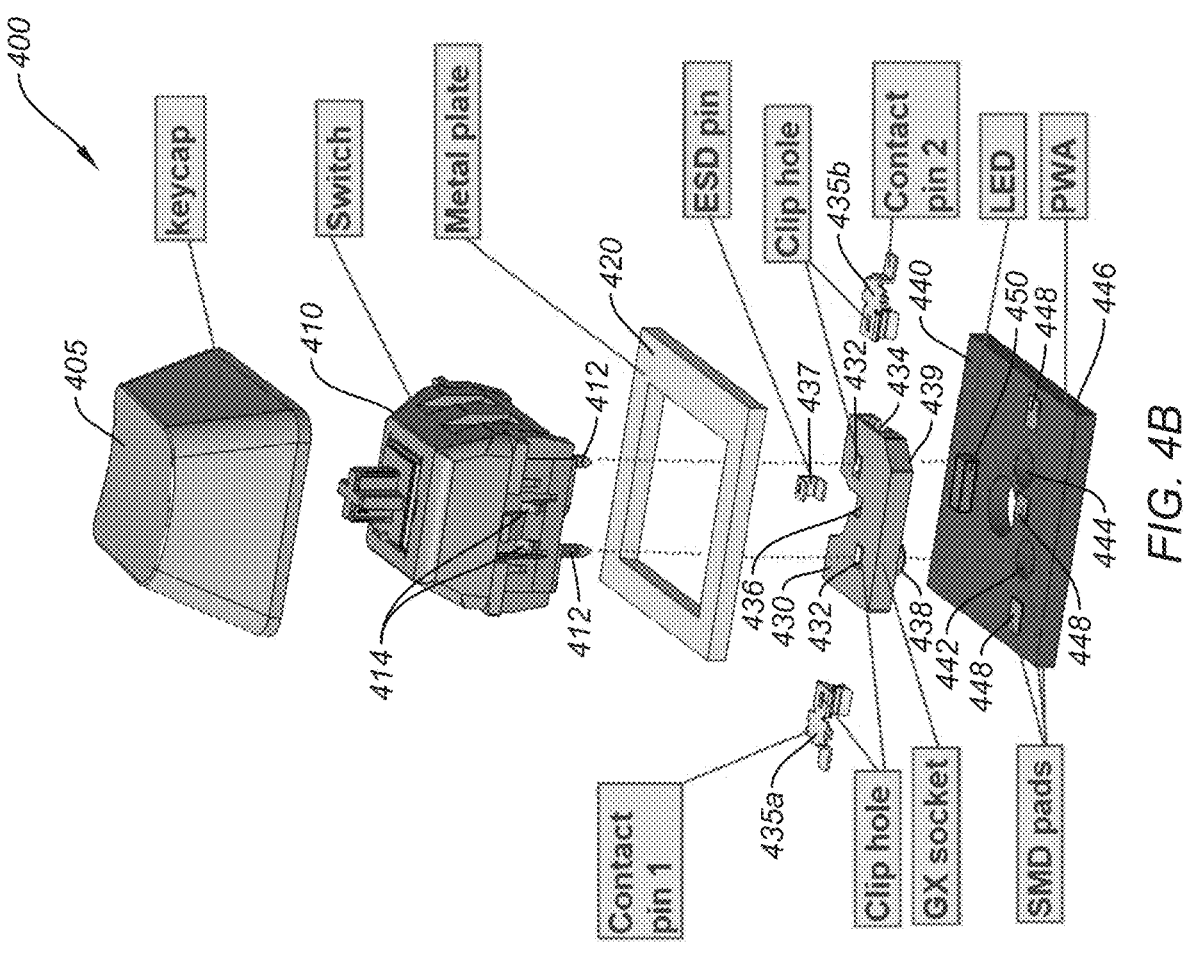
FIG. 4 shows a key structure with a novel bracket structure in both assembled and exploded view, according to certain embodiments.
Figure 4A:
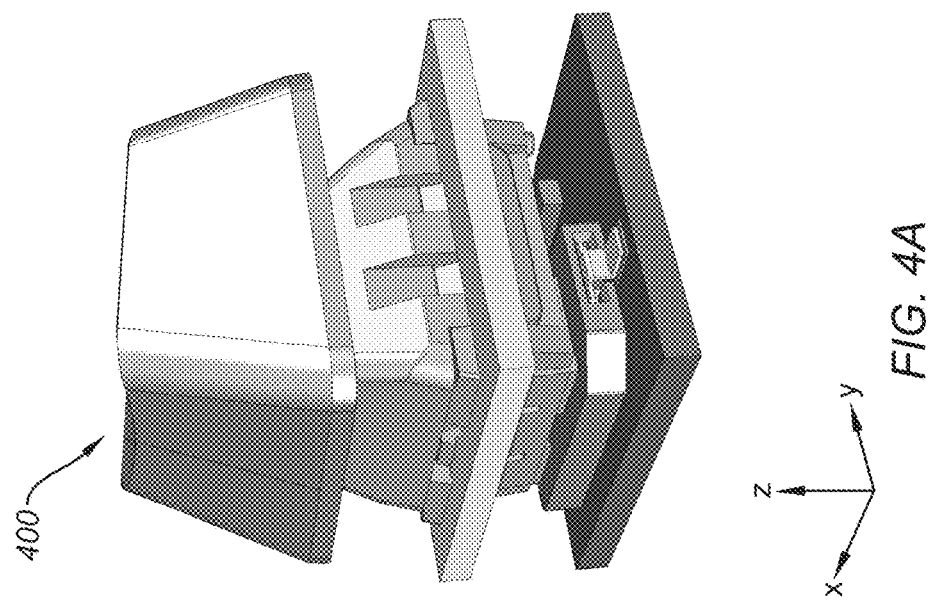

FIG. 4 shows a key structure 400 with a novel bracket structure in both assembled and exploded view, according to certain embodiments. Key structure 400 can include a key cap 405, a key switch 410, a top plate 420, a bracket assembly 430, and a printed circuit board (PCB) 440. Key switch 410 registers the key stroke and can vary in response profiles, sound, travel time and travel distance, as described above.

Top plate 420 can provide structural support for the key switch and can receive clips 414 from key switch 410 that can engage with the top plate when the key switch is coupled to the bracket assembly 430, thereby securing the key structure within the keyboard. In some embodiments, top plate 420 can provide structural support for a plurality of key switches (e.g., >100 keys), which is shown as key frame 320 in FIG. 3. Top plate 420 can extend laterally in any direction, which often appears as a top surface of the keyboard, although top plate 420 may be an intermediary layer. In some aspects, top plate 420 may be planar or may have contouring, for instance, in certain ergonomically contoured keyboards. For example, top plate 420 may have contours in two dimensions (e.g., an XY planar shape as shown in FIG. 4) or three dimensions (e.g., an XYZ shape for contoured surfaces) and the thickness of top plate 420 may vary. Top plate 420 is typically a single monolithic plate with multiple holes to accommodate at least one key structure. However, top plate 420 may include a single hole (e.g., shown in FIG. 4 as a square ring shape) or multiple holes, and top plate 420 may be comprised of multiple continuous or discontinuous sections that can be planar or non-planar. One of ordinary skill in the art with the benefit of this disclosure would appreciate the many modifications, variations, and alternative embodiments thereof.

Bracket assembly ("bracket") 430 may be configured to receive and couple to key switch 410 in a manner that allows a user to "hot swap" or quickly remove and replace key switch 410, for instance, to achieve different key switch profiles. Conventionally, key switches were soldered into place on a PCB or secured by other key structure features that made replacing the key switch a cumbersome and time consuming process. Bracket assembly 430 can allow a user to remove and replace the key switch easily and in a matter of seconds. The top surface of bracket assembly 430 can include holes, slots, or recesses 432 (also referred to as "sockets") configured to receive one or more protrusions 412 (also referred to as "posts" or "pins") from a bottom side of the key switch, as shown in FIG. 4. The one or more protrusions 412 of key switch 410 may include conductive elements that can conduct signals caused by the activation of the key switch, as described above, and as would be appreciated by one of ordinary skill in the art with the benefit of this disclosure. In some embodiments, the bracket assembly as a planar or substantially planar top surface and bottom surface.

Bracket assembly 430 may include holes, slots, or recesses 434 that can receive corresponding conductive leads 435a-b (referred to herein collectively as "conductive leads 435"). Conductive leads 435 can be arranged within bracket assembly 430 such that a portion of conductive leads 435 align with holes 432, 434 in the top surface of bracket assembly 430. Thus, conductive leads 435 from key switch 410 may mechanically and electrically couple to the conductive elements of one or more protrusions 412 when key switch 410 is coupled to bracket assembly 430.

Figure 6A:
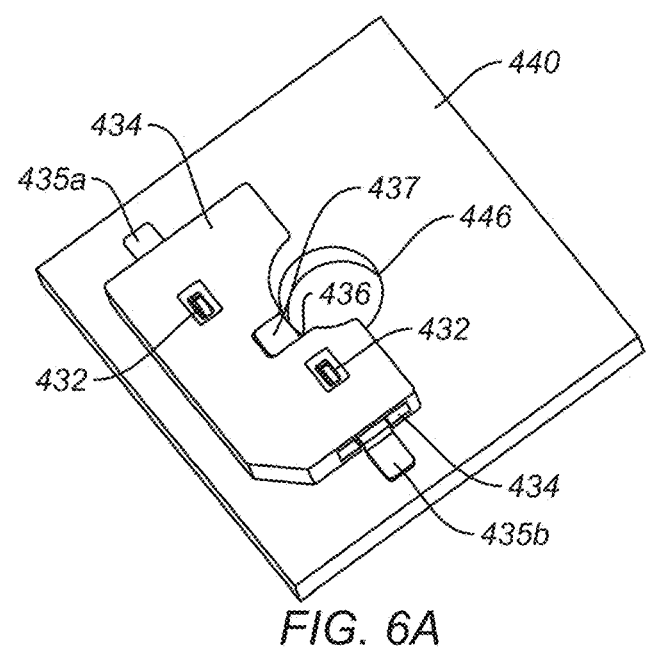
FIGS. 6A-6C show the bracket assembly coupled to a printed circuit board, according to certain embodiments.
Figure 6B:
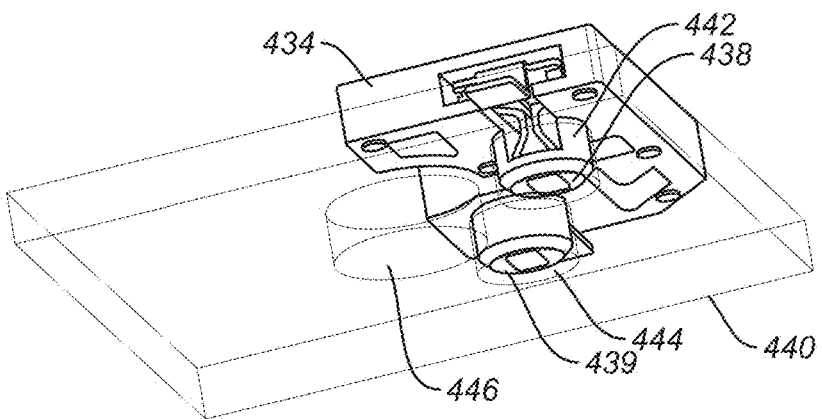
Figure 6C:
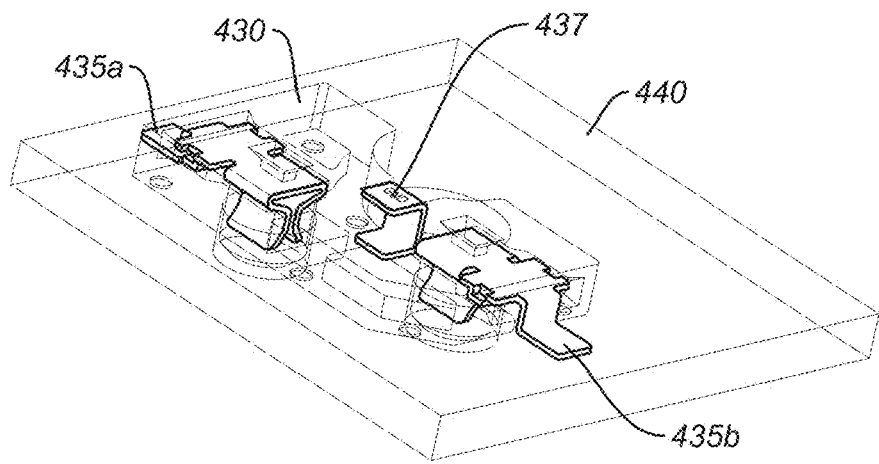

Conductive leads 435 may be spring loaded clips that can be slid into recesses 434, as more readily seen in FIGS. 6B-6C. The spring loaded clips may be retained inside bracket assembly 430 via a compression fit. Although the embodiments depicted herein generally show spring-type conductive leads, other types of conductive leads can be used, such as screws, clips, clamps, tabs, or other suitable mechanism with conductive portions. Conductive leads 435 may extend laterally from bracket assembly 430. Alternatively or additionally, conductive leads 435 may extend radially from bracket assembly 430 in any suitable direction. Conductive leads 435 may be flat or may include a number of bends, different thicknesses, or may split into multiple leads, or the like. In some implementations, conductive leads 435 may at least initially extend from bracket assembly 430 at an angle substantially defined by planar top and bottom surfaces of the bracket assembly. Conductive leads 435 are typically soldered to the top side of PCB 440 (e.g., via a solder reflow process), which are typically locations with conductive pads, pins, areas, or other structure (e.g., conductive pads 448). Thus, a complete conductive path is created when key switch 410 is installed into holes/recesses 432 of bracket assembly 430 that leads from key switch 410 through holes/recesses 432 and laterally/radially out of bracket assembly 430 via conductive leads 435 to the top side of PCB 440, which can be realized via a surface mount, pin, wire, or hardware-based electrical coupling implementation (e.g., screws, pins, tabs, etc.), as would be appreciated by one of ordinary skill in the art with the benefit of this disclosure.

In certain embodiments, a bottom side of bracket assembly 430 may couple to a top surface of PCB 440, as shown in FIG. 4. A printed circuit board, or PCB, is a general term for a technology that allows a conductor to run from one location on the board to another location on the board and from one layer to another, as would be appreciated by one of ordinary skill in the art with the benefit of this disclosure. In some aspects, bracket assembly 430 may include at least two protrusions 438, 439 that extend normal from the bottom surface of bracket assembly 430. PCB 440 may include one or more holes or recesses (e.g., holes 442, 444, 446) that may receive the at least two protrusions 438, 439 when bracket assembly 430 is coupled to the top surface of PCB 440. In some cases, a post (not shown) from key switch 410 may pass partially or fully through hole 446, which may add further stability of the key structure in PCB 440.

Protrusions 438, 439 may extend at least partially through the one or more holes or recesses of PCB 440, as shown in FIGS. 6B-6C. In some cases, protrusions 438, 439 may not extend partially through the one or more holes or recesses of PCB 440, or they may extend all the way through PCB 440. Although PCBs are primarily shown and described throughout the disclosure, other types of boards, such as printed wiring boards (PWBs) can be used and typically comprise an epoxy glass substrate to create electrical interconnections and for connecting to components to create electronic circuits. For the purposes of the present disclosure, PCBs and PWBs can be used interchangeably, and any other type of substrate or mounting surface can be used with the novel key structure arrangement described herein, as would be appreciated by one of ordinary skill in the art with the benefit of this disclosure.

In some embodiments, bracket assembly 430 be configured to only cover a portion of a bottom surface of key switch 410 to accommodate a placement of an LED 450 that can direct light to illuminate a corresponding key cap. LED 450 can be mounted to the top surface of the PCB 440, laterally adjacent to bracket assembly 430, and under key switch 410 at a location not covered by bracket assembly 430. In some aspects, because bracket assembly 430 may only cover a portion of the bottom surface of key switch 410, key structure 400 may be subject to rotational strain when the key cap is pressed due the force imparted on the key cap causing key switch 410 to have a tendency to rotate down over the area under key switch 410 not covered by bracket assembly 430. Top plate 420 can provide structural support to mitigate the rotational strain and possible corresponding rotation of key structure 400. In certain embodiments, top plate 420 may be comprised of a rigid material, such as a metal (e.g., steel, aluminum, etc.) or strong composite material that may be more resistant to flexion and rotation than a plastic top plate can provide. The myriad types of materials that could be used for top plate 420 to better mitigate the rotational strain are not limited to metal and composite embodiments and can include other materials or dimensions (e.g., a thicker top plate), as would be appreciated by one of ordinary skill in the art with the benefit of this disclosure.

In some aspects, bracket assembly 430 may include a mounting location 436 configured to receive an electrostatic discharge (ESD) pin 437 (shown as a conductive bracket) configured to couple ESD (e.g., received from key switch 410, PCB 440, etc.) to a ground plane of PCB 440. ESD pin 437 may be a spring-loaded conductive clip or other suitable conductive hardware or fixture that is electrically coupled to key switch 410 and/or PCB 440.

In exemplary embodiments, a bracket assembly can have a planar or substantially planar top surface and bottom surface. The top surface may be at least two holes with two electrical contacts (e.g., conductive leads) configured to receive conductive pins of a key switch. The conductive leads may extend laterally from the bracket. A bottom surface of the bracket assembly may be configured on a top surface of a substrate (e.g., PCB), and the conductive leads extending laterally from the bracket assembly couple to the top surface of the substrate (e.g., via solder reflow, etc.) The bracket assembly may include one or more protrusions that extend from the bottom of the bracket assembly. The one or more protrusions may extend at least partially into one or more holes or recesses in the substrate. The bracket assembly may include a ground pin. The bracket assembly may include a hole, cutaway, or recess to accommodate a post extending down from the key switch that is mounted to the bracket. In some embodiments, the post may extend through or partially through the substrate.

Figure 8:
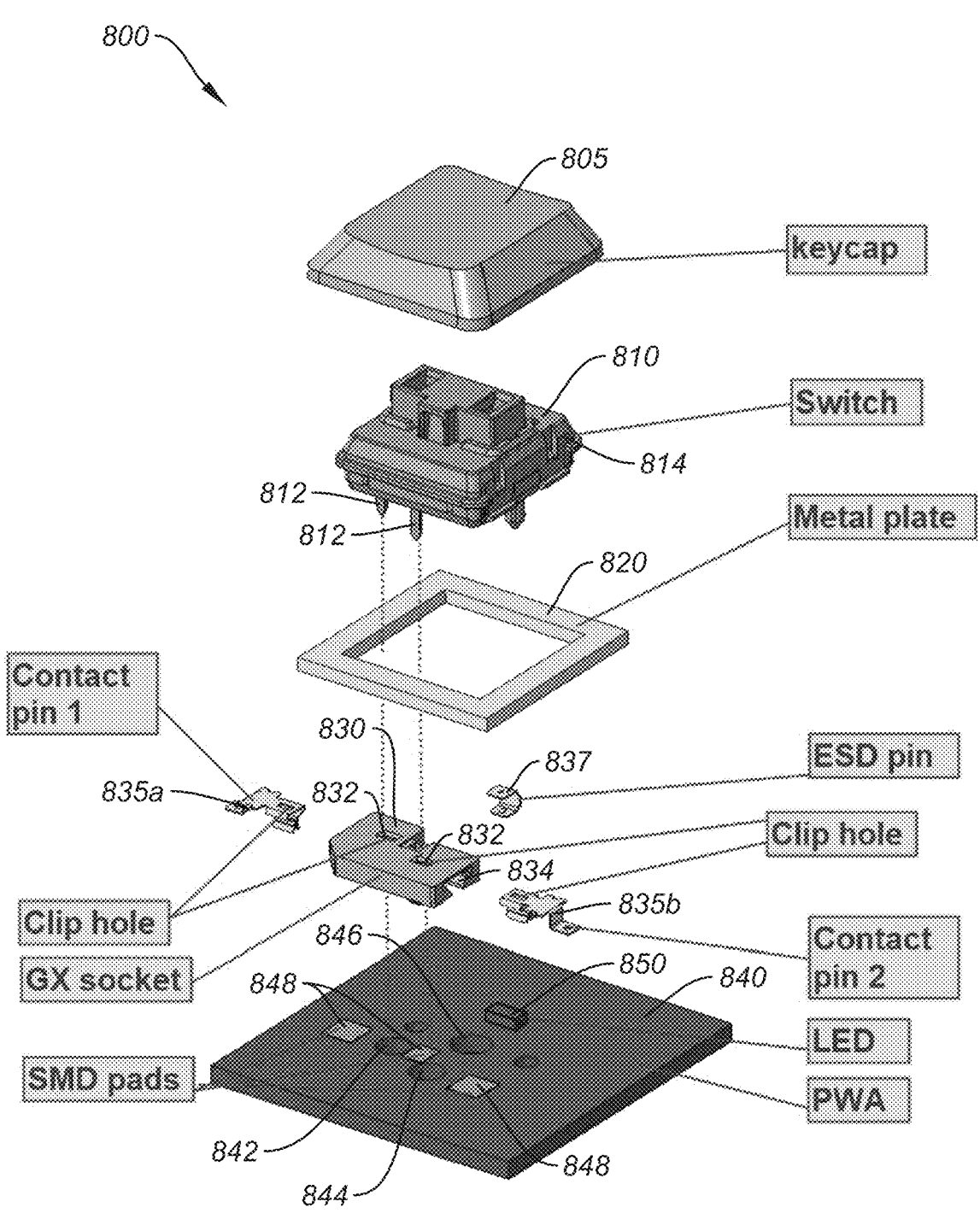
FIG. 8 shows another embodiment of the novel bracket assembly in a key structure to accommodate a low profile key switch, according to certain embodiments.

Depending on embodiments, there may be technical advantages presented by a key structure similar to the one shown in FIG. 4. For instance, bracket assembly 430 can function as a socket that allows for fast and efficient "hot swapping" of key switches, as described above. Manufacturing processes can be simplified as installation of bracket assembly 430 and conductive leads 435 may be performed on one side of the corresponding PCB 440 rather than on both sides. As such, soldering and reflow can be performed on only one side of the PCB. Further, bracket assembly 430 may reduce the height profile of the total key structure, while still leaving enough volumetric area to accommodate LED 450 to individually illuminate a corresponding key cap. The bracket assemblies discussed herein may represent a simple design (in terms of manufacturing and assembly) and can be slightly modified to accommodate many different types of key switches. For instance, FIG. 8 shows a similar key structure to key structure 400, but with a lower profile key switch.

Figures 5A, 5B:
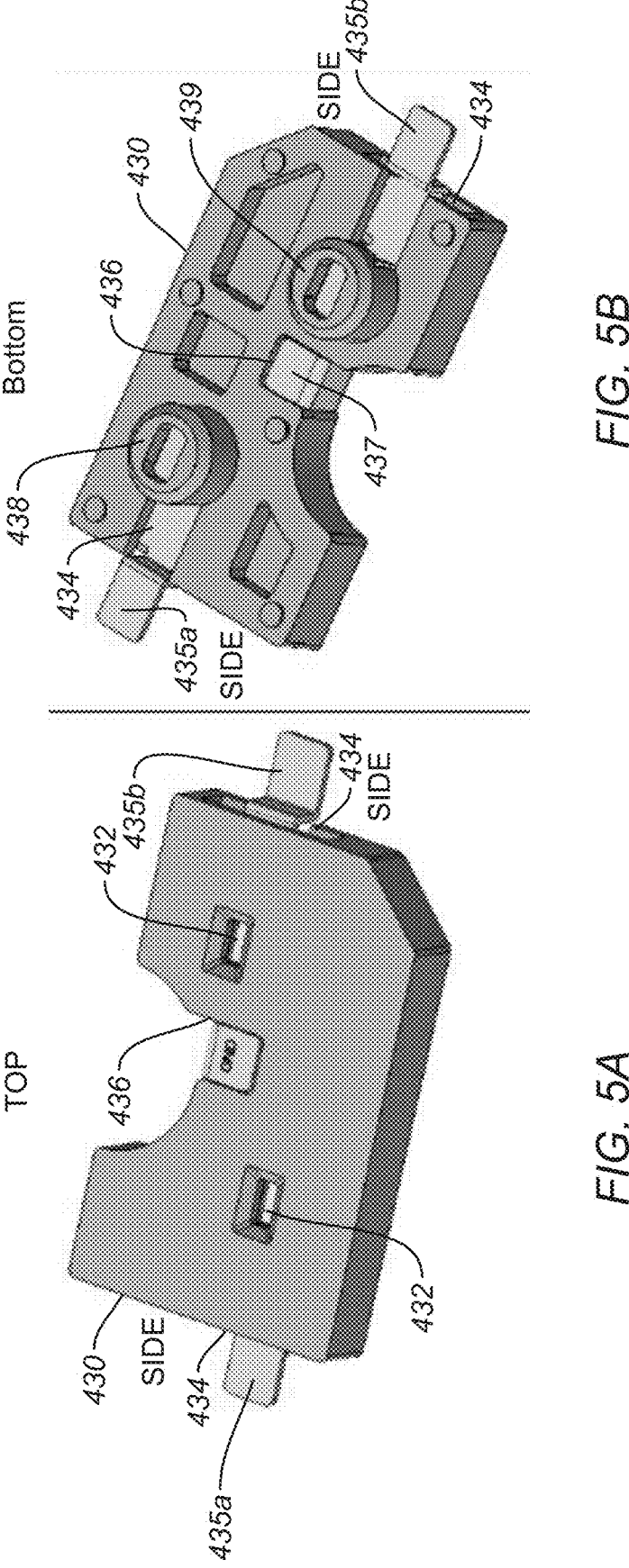
FIGS. 5A and 5B show aspects of the bracket assembly, according to certain embodiments.

FIGS. 5A and 5B show aspects of bracket assembly 430, according to certain embodiments. In FIG. 5A, bracket assembly 430 is shown including holes/recesses 432 in the top side (e.g., to accommodate a portion of conductive leads 435 and key switch protrusions 412), and holes/recesses 434 on the sides (e.g., to install and place conductive leads 435). Bracket assembly 430 further includes mounting location 436 to receive ESD pin 437. FIG. 5B shows the bottom of bracket assembly 430 including protrusions 438, 439. In these images, as well as FIGS. 6B-6C, it is more readily seen how conductive leads 435 are configured within protrusions 438, 439 (to couple to the conductive element of the protrusions 412 of key switch 410) and extend laterally out of recesses 434 to make a continuous electrical path from key switch 410 to PCB 440 when coupled thereto (e.g. at conductive pads 448), as described above.

FIGS. 6A-6C show bracket assembly 430 coupled to printed circuit board 440, according to certain embodiments. More specifically, FIGS. 6A and 6B show how the bottom surface/side of bracket assembly 430 is coupled to a top side/surface of PCB 440. In FIG. 6B, PCB 440 is presented with a transparent representation to better illustrate how the protrusions 438, 439 of bracket assembly 430 can fit within PCB 440. Protrusions 438, 439 may extend at least partially through the one or more holes or recesses 442, 444 of PCB 440, as shown. In some cases, protrusions 438, 439 may not extend partially through PCB 440, or they may extend all the way through. In some embodiments, bracket assembly 430 may not have protrusions 438, 439 and may couple to PCB 440 via adhesive, hardware (e.g., screws, clips, screws, pins, etc.), or a combination thereof. Conductive leads 435 may or may not extend partially into protrusions 438, 439. Protrusions 438, 439 can provide a barrier between conductive leads 435 and surrounding PCB 440 to prevent inadvertent electrical short circuiting therebetween. FIG. 6C is presented with a transparent representation of bracket assembly 430 and PCB 440 to better illustrate the structure of conductive leads 425 and ESD pin 437, according to certain embodiments.

Figure 7:
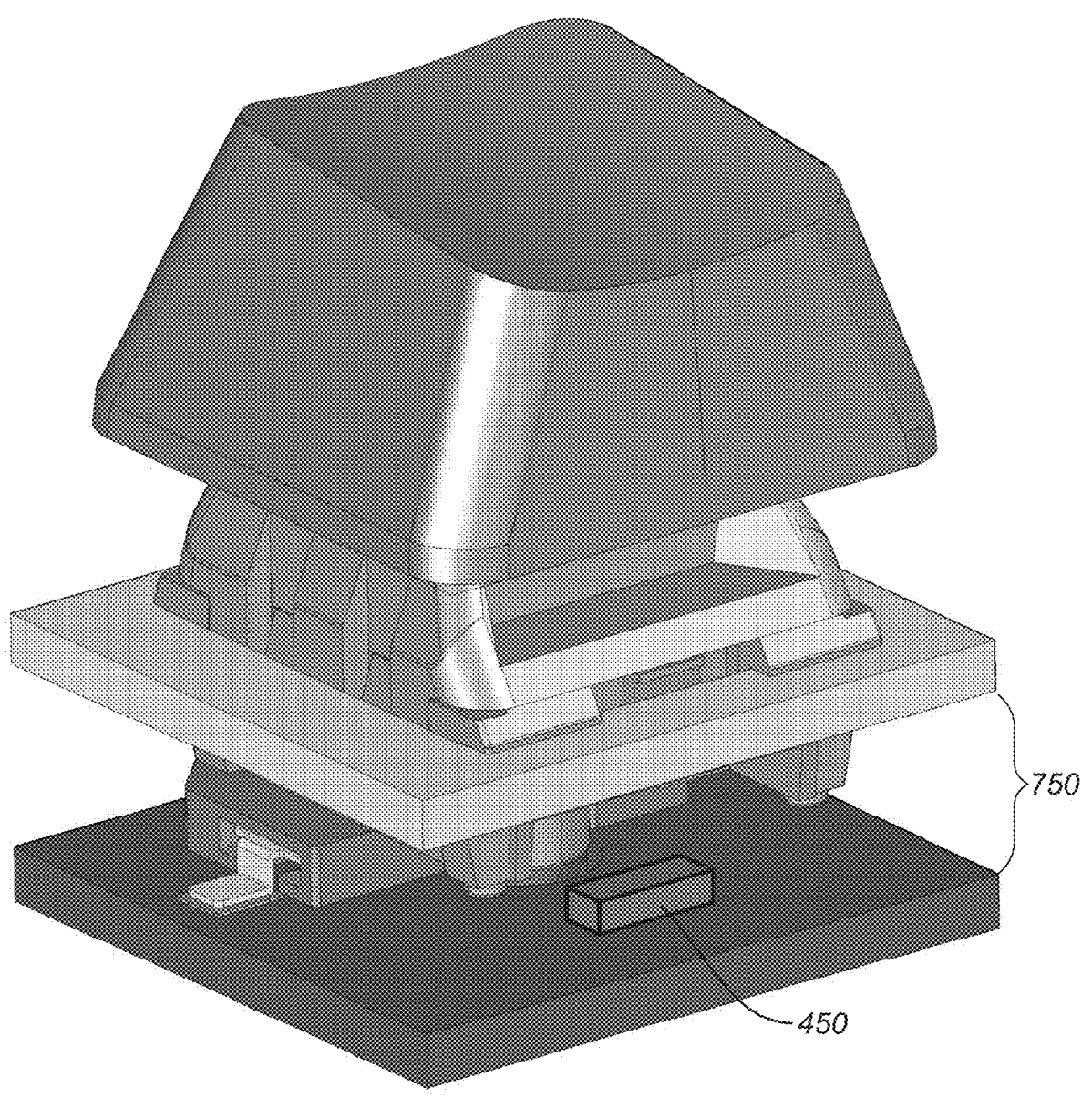
FIG. 7 shows aspects of the bracket assembly that accommodate the placement of a light emitting diode structure, according to certain embodiments.

FIG. 7 shows aspects of the bracket assembly that accommodate the placement of a light emitting diode structure, according to certain embodiments. As described above, bracket assembly 430 be configured to only cover a portion of a bottom surface of key switch 410 to accommodate a placement of an LED 450 that can direct light to illuminate a corresponding key cap. For example, the key cap may include a transparent portion, typically in the shape of a character or symbol (e.g., alphanumeric characters, special characters, etc.) that light can travel through to illuminate the character or symbol. LED 450 can be mounted to the top surface of the PCB 440 at region 750, which is laterally adjacent to bracket assembly 430 and under key switch 410, according to certain embodiments.

FIG. 8 shows another embodiment of the novel bracket assembly in a key structure to accommodate a low profile key switch, according to certain embodiments. Key structure 800 may assemble and operate in a similar manner as the embodiments of FIGS. 4-7. For instance, key structure 800 can include key switch 810, top plate 820, and bracket assembly 830. Key switch 810 may be a low-profile type key switch and can be secured to top plate 820 via clips 814 and coupled to bracket assembly 830 via protrusions 812 and recesses 832. Bracket assembly 830 may couple to PCB 840 via protrusions 838, 839 (not shown) and holes 842, 844, as shown. In some aspects, low profile key switch 810 may or may not have enough volumetric area under key switch 810 and adjacent to bracket assembly 830 to accommodate an LED. One of ordinary skill in the art with the benefit of this disclosure would appreciate the many modifications, variations, and alternative embodiments thereof.

Numerous specific details are set forth herein to provide a thorough understanding of the claimed subject matter. However, those skilled in the art will understand that the claimed subject matter may be practiced without these specific details. In other instances, methods, apparatuses, or systems that would be known by one of ordinary skill have not been described in detail so as not to obscure claimed subject matter. The various embodiments illustrated and described are provided merely as examples to illustrate various features of the claims. However, features shown and described with respect to any given embodiment are not necessarily limited to the associated embodiment and may be used or combined with other embodiments that are shown and described. Further, the claims are not intended to be limited by any one example embodiment.

While the present subject matter has been described in detail with respect to specific embodiments thereof, it will be appreciated that those skilled in the art, upon attaining an understanding of the foregoing may readily produce alterations to, variations of, and equivalents to such embodiments. Accordingly, it should be understood that the present disclosure has been presented for purposes of example rather than limitation, and does not preclude inclusion of such modifications, variations, and/or additions to the present subject matter as would be readily apparent to one of ordinary skill in the art. Indeed, the methods and systems described herein may be embodied in a variety of other forms; furthermore, various omissions, substitutions and changes in the form of the methods and systems described herein may be made without departing from the spirit of the present disclosure. The accompanying claims and their equivalents are intended to cover such forms or modifications as would fall within the scope and spirit of the present disclosure.

Conditional language used herein, such as, among others, "can," "could," "might," "may," "e.g.," and the like, unless specifically stated otherwise, or otherwise understood within the context as used, is generally intended to convey that certain examples include, while other examples do not include, certain features, elements, and/or steps. Thus, such conditional language is not generally intended to imply that features, elements and/or steps are in any way required for one or more examples or that one or more examples necessarily include logic for deciding, with or without author input or prompting, whether these features, elements and/or steps are included or are to be performed in any particular example.

The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list. The use of "adapted to" or "configured to" herein is meant as open and inclusive language that does not foreclose devices adapted to or configured to perform additional tasks or steps. Additionally, the use of "based on" is meant to be open and inclusive, in that a process, step, calculation, or other action "based on" one or more recited conditions or values may, in practice, be based on additional conditions or values beyond those recited. Similarly, the use of "based at least in part on" is meant to be open and inclusive, in that a process, step, calculation, or other action "based at least in part on" one or more recited conditions or values may, in practice, be based on additional conditions or values beyond those recited. Headings, lists, and numbering included herein are for ease of explanation only and are not meant to be limiting.

The various features and processes described above may be used independently of one another, or may be combined in various ways. All possible combinations and sub-combinations are intended to fall within the scope of the present disclosure. In addition, certain method or process blocks may be omitted in some embodiments. The methods and processes described herein are also not limited to any particular sequence, and the blocks or states relating thereto can be performed in other sequences that are appropriate. For example, described blocks or states may be performed in an order other than that specifically disclosed, or multiple blocks or states may be combined in a single block or state. The example blocks or states may be performed in serial, in parallel, or in some other manner. Blocks or states may be added to or removed from the disclosed examples. Similarly, the example systems and components described herein may be configured differently than described. For example, elements may be added to, removed from, or rearranged compared to the disclosed examples.

What is claimed is:

1. A system comprising:
   a printed circuit board (PCB) including a top surface;
   a bracket body including:
      a plurality of sockets configured on a top surface of the bracket body, the plurality of sockets configured to receive, secure, and electrically couple to a plurality of electrical pins of a keyswitch; and
      a bottom surface of the bracket body including at least two protrusions of the bracket body that extend normal to the bottom surface of the bracket body,
      wherein the bracket body is configured to mount to the PCB such that the bottom surface of the bracket body is coupled to the top surface of the PCB,
      wherein the at least two protrusions of the bracket body extend through the PCB when the bracket is mounted to the PCB, and
      wherein the at least two protrusions each include conductive leads that electrically couple to the plurality of sockets on the top surface of the PCB.

2. The system of claim 1 wherein the bracket body is configured to only cover a portion of a bottom surface of the keyswitch when coupled to the key switch.

3. The system of claim 2 further comprising an LED mounted to the top surface of the PCB, laterally adjacent to the bracket body, and under the keyswitch at a location not covered by the bracket.

4. The system of claim 1 further comprising a top plate configured to provide structural support for the keyswitch.

5. The system of claim 4 wherein the top plate is configured to receive clips from the keyswitch that engage with the top plate when the keyswitch is coupled to the bracket body.

6. The system of claim 1 wherein the PCB includes at least two holes configured to receive the two protrusions from the bracket when the bracket body is coupled to the top surface of the PCB.

7. The system of claim 6 wherein the top surface of the bracket body includes one or more holes or recesses configured to receive one or more protrusions from the keyswitch.

8. The system of claim 1 wherein the conductive leads are soldered to the PCB via a solder reflow process.

9. An apparatus comprising:

a bracket body including:

a top surface of the bracket body including sockets configured to:

receive two or more electrical pins of a keyswitch; and secure the keyswitch to the bracket body; and a bottom surface of the bracket body including at least two bracket body protrusions of the bracket body that extend normal to the bottom surface of the bracket, wherein the bracket body is configured to mount to a printed circuit board (PCB) such that the bottom surface of the bracket body is coupled to a top surface of the PCB, wherein the at least two protrusions each include conductive leads that are electrically coupled to the sockets and configured to couple to the top surface of the PCB, wherein the at least two protrusions of the bracket body extend at least partially through the PCB when the bracket is mounted to the PCB, wherein the conductive leads of the at least two protrusions extend laterally from the bracket body, and wherein a conductive path is closed when the keyswitch is triggered that leads from the keyswitch to the bracket body and laterally from the bracket body to the top surface of the PCB via the conductive leads.

10. The apparatus of claim 9 wherein the bracket body is configured to only cover a portion of a bottom surface of the keyswitch when coupled to the keyswitch.

* * * * *